(12) United States Patent
Kuenemund et al.

(10) Patent No.: US 9,385,726 B2
(45) Date of Patent: Jul. 5, 2016

(54) CHIP AND METHOD FOR MANUFACTURING A CHIP

(71) Applicant: Infineon Technologies AG, Neubiberg (DE)

(72) Inventors: Thomas Kuenemund, Munich (DE); Bernhard Lippmann, Landshut (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/254,913

(22) Filed: Apr. 17, 2014

(65) Prior Publication Data

US 2015/0303927 A1 Oct. 22, 2015

(51) Int. Cl.
| | |
|---|---|
| H03K 19/21 | (2006.01) |
| H01L 27/02 | (2006.01) |
| H01L 27/118 | (2006.01) |
| H03K 19/177 | (2006.01) |
| H01L 23/00 | (2006.01) |
| H01L 21/70 | (2006.01) |
| H01L 27/088 | (2006.01) |
| H01L 27/092 | (2006.01) |

(52) U.S. Cl.
CPC ............ *H03K 19/215* (2013.01); *H01L 23/576* (2013.01); *H01L 27/0203* (2013.01); *H01L 27/0207* (2013.01); *H01L 27/11807* (2013.01); *H03K 19/17768* (2013.01); *H01L 27/088* (2013.01); *H01L 27/092* (2013.01)

(58) Field of Classification Search
CPC .... G06F 21/76; G06F 21/75; H03K 19/17768; H03K 19/215; G11C 16/22; G01R 31/31719; H01L 23/576; H01L 27/0203; H01L 27/088; H01L 27/092
See application file for complete search history.

(56) References Cited

U.S. PATENT DOCUMENTS

| | | | |
|---|---|---|---|
| 8,410,526 B2 * | 4/2013 | Shimizu | .......................... 257/207 |
| 8,418,091 B2 * | 4/2013 | Chow et al. | ................... 716/101 |
| 2009/0313596 A1 | 12/2009 | Lippmann et al. | |

OTHER PUBLICATIONS

"Degate Project", http://www.degate.org; 2 pages.
M. Eick, "Structure and Signal Path Analysis for Analog and Digital Circuits", 169 pages, May 8, 2013, http://mediatum.ub.tum.de/doc/1128811/1128811.pdf.
J.Rajendran et al., "Security Analysis of Integrated Circuit Camouflaging", CCS'13, Nov. 4-8, 2013; 12 pages.

* cited by examiner

*Primary Examiner* — Vibol Tan

(57) ABSTRACT

According to one embodiment, a chip is described comprising a plurality of supply lines delimiting a plurality of cell areas and a gate comprising a first transistor and a second transistor, wherein the first transistor is located in a first cell area of the plurality of cell areas and the second transistor is located in a second cell area of the plurality of cell areas such that a supply line of the plurality of supply lines lies between the first cell area and the second cell area.

20 Claims, 11 Drawing Sheets

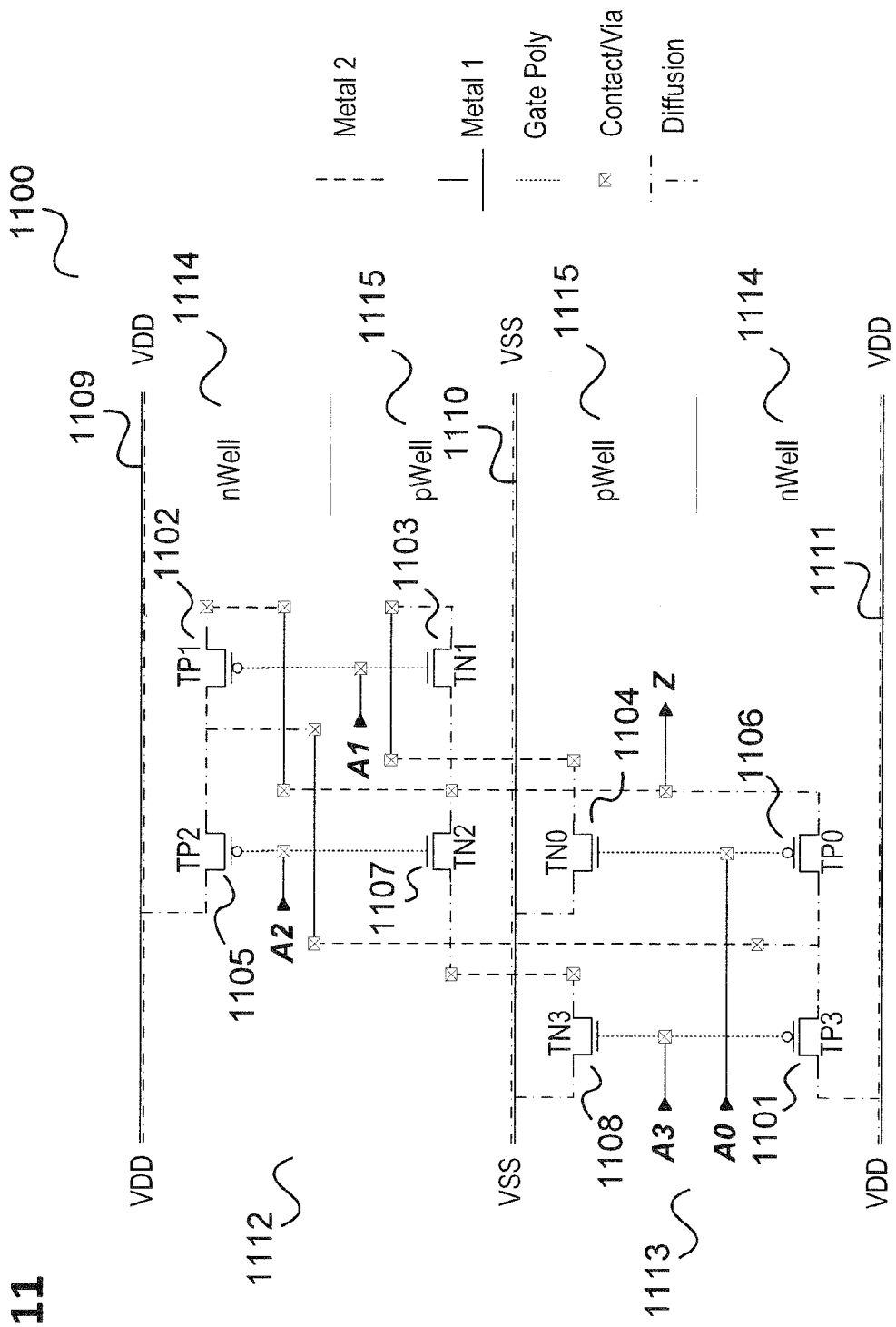

CHIP AND METHOD FOR MANUFACTURING A CHIP

TECHNICAL FIELD

The present disclosure relates to a chip and a method for manufacturing a chip.

BACKGROUND

Reverse Engineering (RE) of integrated circuits (ICs) can be considered as one of the most serious threats to semiconductor industry, since it may be misused by an attacker to steal and/or pirate a circuit design. An attacker who successfully reverse engineers an integrated circuit can fabricate and sell a similar, i.e. cloned, circuit and illegally sell and reveal the design.

Therefore concepts and techniques that thwart reverse engineering of integrated circuits are desirable.

SUMMARY

According to one embodiment, a chip is provided including a plurality of supply lines delimiting a plurality of cell areas and a gate including a first transistor and a second transistor, wherein the first transistor is located in a first cell area of the plurality of cell areas and the second transistor is located in a second cell area of the plurality of cell areas such that a supply line of the plurality of supply lines lies between the first cell area and the second cell area.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects are described with reference to the following drawings, in which:

FIG. 11 illustrates the implementation of an ANDNOR gate according to one embodiment.

DESCRIPTION

The following detailed description refers to the accompanying drawings that show, by way of illustration, specific details and aspects of this disclosure in which the invention may be practiced. Other aspects may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

Reverse engineering can be hindered by deploying camouflage circuits. However, these typically require process technology extensions like doping profile modifications, faked contacts or vias and/or entail significantly increased area and energy consumption. Thus, these measures are often too expensive for mass products, e.g. in terms of license fees, silicon area or energy consumption.

In the following a chip is described with an increased necessary effort for a successful reverse engineering of the chip.

Figure 1:
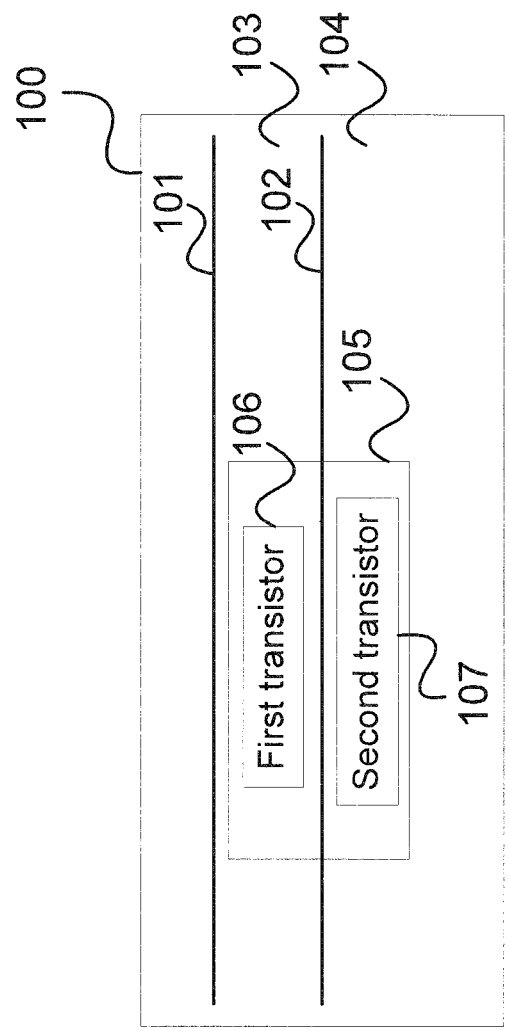
FIG. 1 shows a chip according to an embodiment.

FIG. 1 shows a chip 100 according to an embodiment.

The chip 100 includes a plurality of supply lines 101, 102 delimiting a plurality of cell areas 103, 104. Further, the chip 100 includes a gate 105 including a first transistor 106 and a second transistor 107, wherein the first transistor 106 is located in a first cell area 103 of the plurality of cell areas and the second transistor is located in a second cell area 104 of the plurality of cell areas such that a supply line 102 of the plurality of supply lines lies between the first cell area 103 and the second cell area 104.

In other words, a logic gate is distributed or split over a plurality of cell areas. Thus, an attacker searching for the logic gate, e.g. identifying gates (or cells) by pattern recognition, cannot find the gate if he is searching only within one cell area but needs to consider a plurality of cell areas. For example, instead of searching for pattern within one cell area, an attacker needs to take into account that parts of the pattern may be located in neighboring cell areas.

This significantly increases the effort of a successful reverse engineering. The gate may be seen to be camouflaged by distributing it over more than one cell areas. Accordingly, it is also referred to as camouflaged gate or camouflaged cell in the following.

The approach of distributing (or splitting) the gate over a plurality of cell areas is referred to as SPLIT GATE approach (or concept) and the gate is also referred to as SPLIT GATE.

According to various embodiments, the gate is a combinatorial gate, i.e. implements a Boolean function. According to one embodiment, the gate is a Boolean or a sequential gate.

The gate may be a complex gate, e.g. an ANDNOR, an ORNAND, or an ANDORNAND etc.

The gate may implement a basic Boolean function.

The basic Boolean function is for example a Boolean NOT, a Boolean AND, a Boolean OR, a Boolean NAND, a Boolean NOR, a Boolean EXOR or a Boolean EXNOR.

According to one embodiment, the transistors are field effect transistors.

For example, the first transistor and the second transistor are both p channel field effect transistors or are both n channel field effect transistors.

According to one embodiment, the gate is implemented in CMOS technology.

The gate may include a multiplicity of transistors, wherein a first subset of the multiplicity of transistors is located in the first cell area and a second subset of the multiplicity of transistors is located in the second cell area.

For example, the first subset and the second subset both include at least one n channel field effect transistor and at least one p channel field effect transistor.

The cell areas are for example cell rows.

According to one embodiment, the supply lines of the plurality of supply lines are arranged (substantially) in parallel to each other.

The plurality of supply lines for example alternately includes a supply line for a high supply potential and a supply line for a low supply potential.

Each cell area is for example limited at one side by a supply line for a high supply potential and on another side by a supply line for a low supply potential.

According to one embodiment, the cell areas are cell rows and the gate occupies only a half of the first cell area or only a half of the second cell area according to a horizontal splitting of the cell areas into halves.

According to one embodiment, the chip includes a multiplicity of supply lines delimiting a multiplicity of cell areas and a multiplicity of gates, each gate including a first transistor and a second transistor, wherein the first transistor is located in a first cell area of the multiplicity of cell areas and the second transistor is located in a second cell area of the multiplicity of cell areas such that a supply line of the multiplicity of supply lines lies between the first cell area and the second cell area.

The multiplicity of gates is for example connected to form an integrated circuit.

The chip may further include one or more further gates which each lie within one cell area of the multiplicity of cell areas.

The multiplicity of gates and the one or more further gates may be connected to form an integrated circuit.

Figure 2:
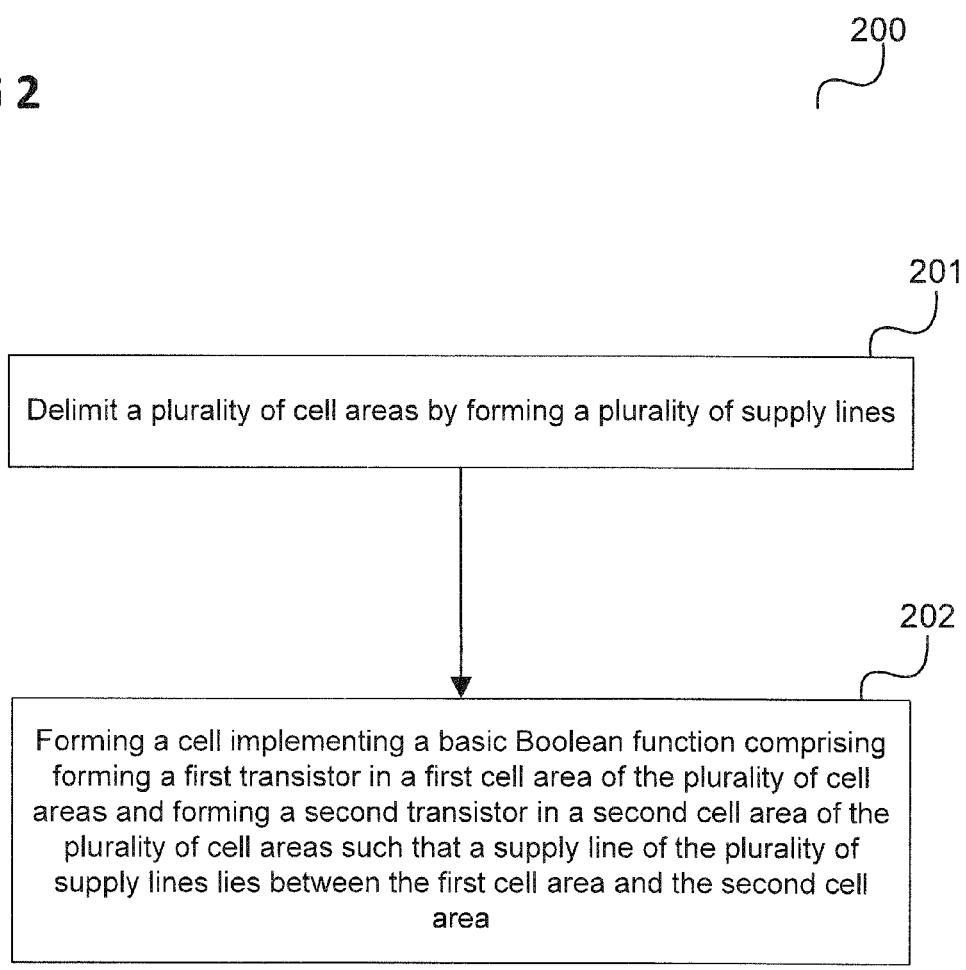
FIG. 2 shows a flow diagram illustrating a method for manufacturing a chip.

According to one embodiment, a method for manufacturing a chip is provided as illustrated in FIG. 2.

FIG. 2 shows a flow diagram 200 illustrating a method for manufacturing a chip.

In 201, a plurality of cell areas is delimited by forming a plurality of supply lines.

In 202, a gate is formed. The forming of the gate includes forming a first transistor in a first cell area of the plurality of cell areas and forming a second transistor in a second cell area of the plurality of cell areas such that a supply line of the plurality of supply lines lies between the first cell area and the second cell area.

The forming of the gate may include the forming of further components, e.g. transistors, of the gate and connecting the various components (including the first transistor and the second transistor) according to the (e.g. Boolean) function to be provided by the gate.

It should be noted that embodiments described in context with the chip 100 are analogously valid for the method illustrated in FIG. 2 and vice versa.

In the following, embodiments are described in more detail.

The SPLIT GATE approach for IC camouflaging can be seen to be based on splitting a given gate (or generally a standard cell) into components, e.g. into its pMOS (p channel metal oxide semiconductor) transistors and nMOS (n channel MOS) transistors and allocating these components to different (e.g. neighboring) cell areas, e.g. standard cell rows. That is, instead of allocating pMOS transistors and nMOS transistors of a gate within one cell row, the pMOS and nMOS components (i.e. transistors) of a SPLIT GATE are scattered across two or more (e.g. neighbouring) standard cell rows.

Hence, for a reverse engineer to be successful he needs to correctly interpret complete and correct data related to
MOS active areas ("diffusion"),
diffusion-metal-1 contacts,
metal-1 wiring,
metal-1-gate-poly contacts,
gate-poly wiring,
metal-1-metal-2 vias, and
metal-2 wiring and concerning at least neighbouring standard cell rows in order to extract reliably the respective SPLIT GATE's transistor netlist and function. Thus, the effort and risk for correct reverse engineering is increased significantly by the SPLIT GATE approach.

Moreover, it is also possible to use "half-integral" cell heights, i.e. 1.5, 2.5 etc. cell rows for the actual camouflage cell (e.g. the SPLIT GATE) and filling the remaining cell row halves with dummy pMOS or nMOS devices (i.e. transistors), or to concatenate "half-integral" SPLIT-GATEs, i.e. to concatenate SPLIT-GATES which each only occupy halves of (a plurality of) cell rows. In addition to that, e.g. L- and T- and Z-shaped SPLIT-GATEs may also be used. This means that the SPLIT-GATE concept is not restricted to rectangular cell shapes.

The SPLIT GATE approach can be combined with intra-cell variations of the pMOS and nMOS component's geometrical properties like gate width and orientation as well as pin locations corresponding to a given cell function, i.e. to generate families of geometrically different realizations of gates exhibiting the same functionality and switching characteristics.

Variation of nWell-widths and pWell-widths within a particular SPLIT-GATE may be used to additionally hamper reverse engineering since knowledge of the actual well structure is compulsory in order to avoid confusion as to the nature of a MOS device (e.g. a pMOS transistor mistakenly identifying as an nMOS transistor and vice versa).

SPLIT-GATE camouflaged gates can be combined with standard logic gates to achieve a reverse engineering-resistant IC implementation. Since a multitude of SPLIT-GATEs can be distributed irregularly across an IC's entire Semi-Custom portion (as well as within a Full Custom circuitry) the SPLIT-GATE concept can be used to significantly increase the difficulty, risk and effort for IC Reverse Engineering.

It should be noted that SPLIT-GATEs do not require any process technology modification and can be applied to any technology, e.g. CMOS (complementary MOS) technology.

The SPLIT-GATE concept can also be applied to full custom implementations of data paths, memory macros, etc., and their respective control logic. Moreover, the SPLIT-GATE concept is not restricted to static CMOS implementations, but can also be applied to other logic styles like Transmission Gate Logic, N-Pass-Gate Logic, (Dynamical) Precharge Logic, etc., used for example in self-timed circuitry or asynchronous designs.

In addition to that, the SPLIT-GATE camouflage concept can also be combined with other camouflage techniques. For example, a gate that has a camouflage property by itself may be distributed over a plurality of cell areas.

In the following, the SPLIT-GATE concept is illustrated for a NAND gate, as example.

Figure 3:
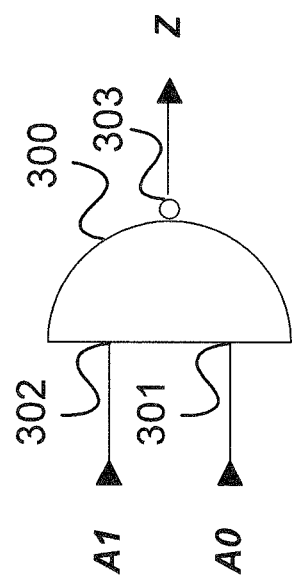
FIG. 3 shows the gate symbol and the inputs and output of a NAND gate.

FIG. 3 shows the gate symbol and the inputs and output of a NAND gate 300.

The NAND gate 300 has a first input 301 receiving a signal A0, a second input 302 receiving a signal A1 and an output 303 outputting a signal Z wherein Z=NAND (A1, A0).

Figure 4:
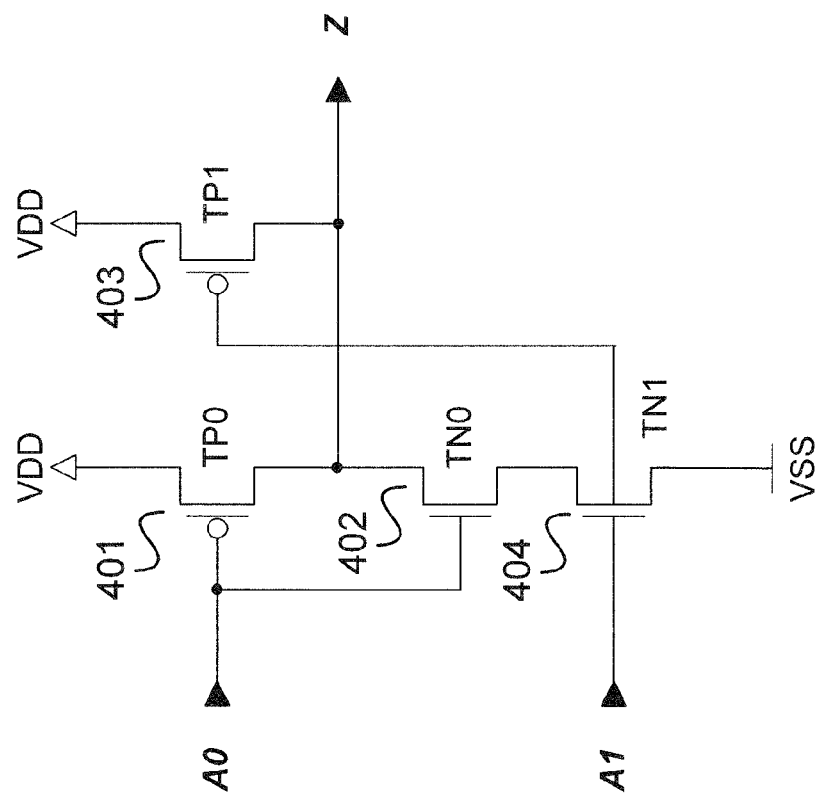
FIG. 4 shows the transistor schematic of a NAND gate.

FIG. 4 shows the transistor schematic of a NAND gate 400.

The NAND gate 400 includes a first p channel field effect transistor (FET) 401 whose source is connected to a high supply potential (VDD), whose gate is supplied with the signal A0 and whose drain is connected to the drain of a first n channel FET 402.

The NAND gate 400 further includes a second p channel FET 403 whose source is connected to the high supply potential, whose gate is supplied with the signal A1 and whose drain is connected to the drain of a first n channel FET 402. The state at this connection represents the output signal Z.

The gate of the first n channel FET 402 is supplied with the signal A0 and its source is connected to the drain of a second n channel FET 404 whose source is connected to a low supply potential (VSS) and whose gate is supplied with the signal A1.

Figure 5:
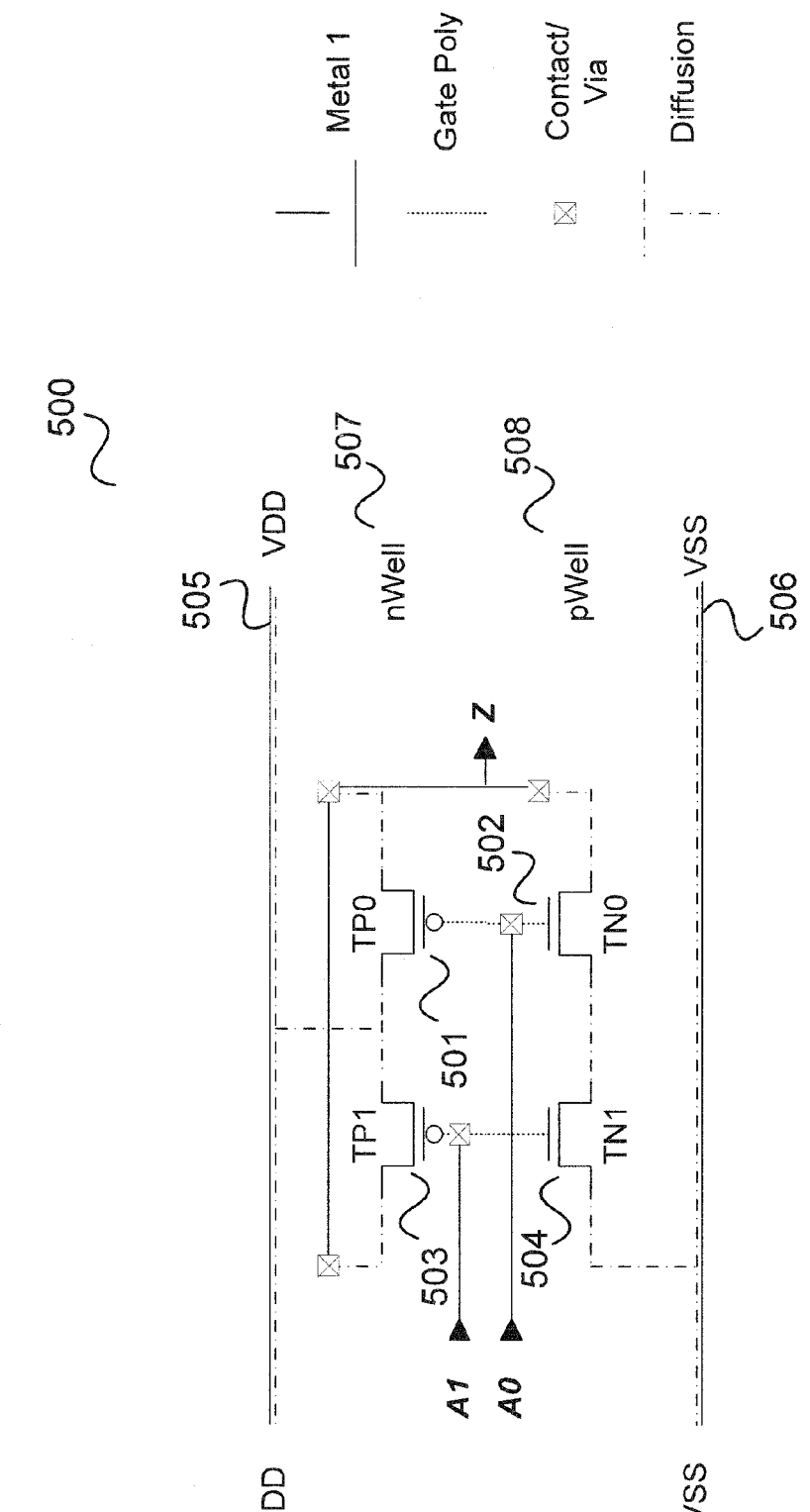
FIG. 5 illustrates the implementation of a NAND gate on a chip.

An implementation of the NAND gate 400 within one cell row is illustrated in FIG. 5.

FIG. 5 illustrates the implementation of a NAND gate 500 on a chip.

The illustration of FIG. 5 can be seen as a "physical schematic", indicating the relative positions of nMOS and pMOS transistors within a standard cell row as well as the intra-cell wirings (diffusion, gate poly and M1, i.e. metal-1, i.e. first metal layer), and contacts.

The NAND gate 500 includes a first p channel MOSFET 501 corresponding to the first p channel FET 401, a second p channel MOSFET 503 corresponding to the second p channel FET 403, a first n channel MOSFET 502 corresponding to the first n channel FET 402 and a second n channel MOSFET 504 corresponding to the second n channel FET 404 which are connected as explained with reference to FIG. 4.

The high supply potential is provided by a first supply line 505 and the low supply potential is provided by a second supply line 506. The area between the supply lines 505, 506 is a cell row. The cell row includes an nWell 507 and a pWell 508, wherein the p channel MOSFETs 501, 503 are located within the nWell 507 and the n channel MOSFETs 502, 504 are located within the pWell 508.

Figure 6:
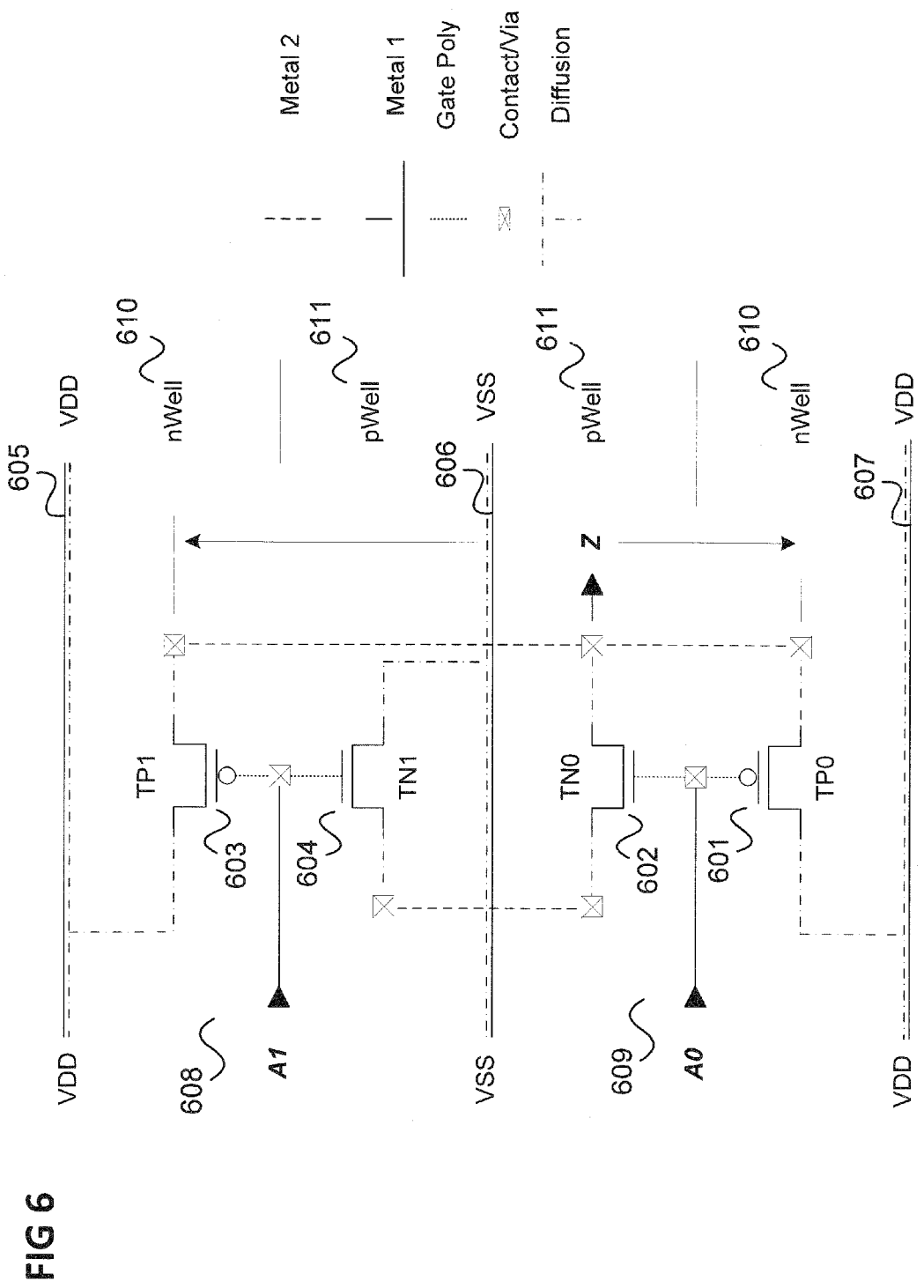
FIG. 6 illustrates the implementation of a NAND gate according to one embodiment.
Figure 7:
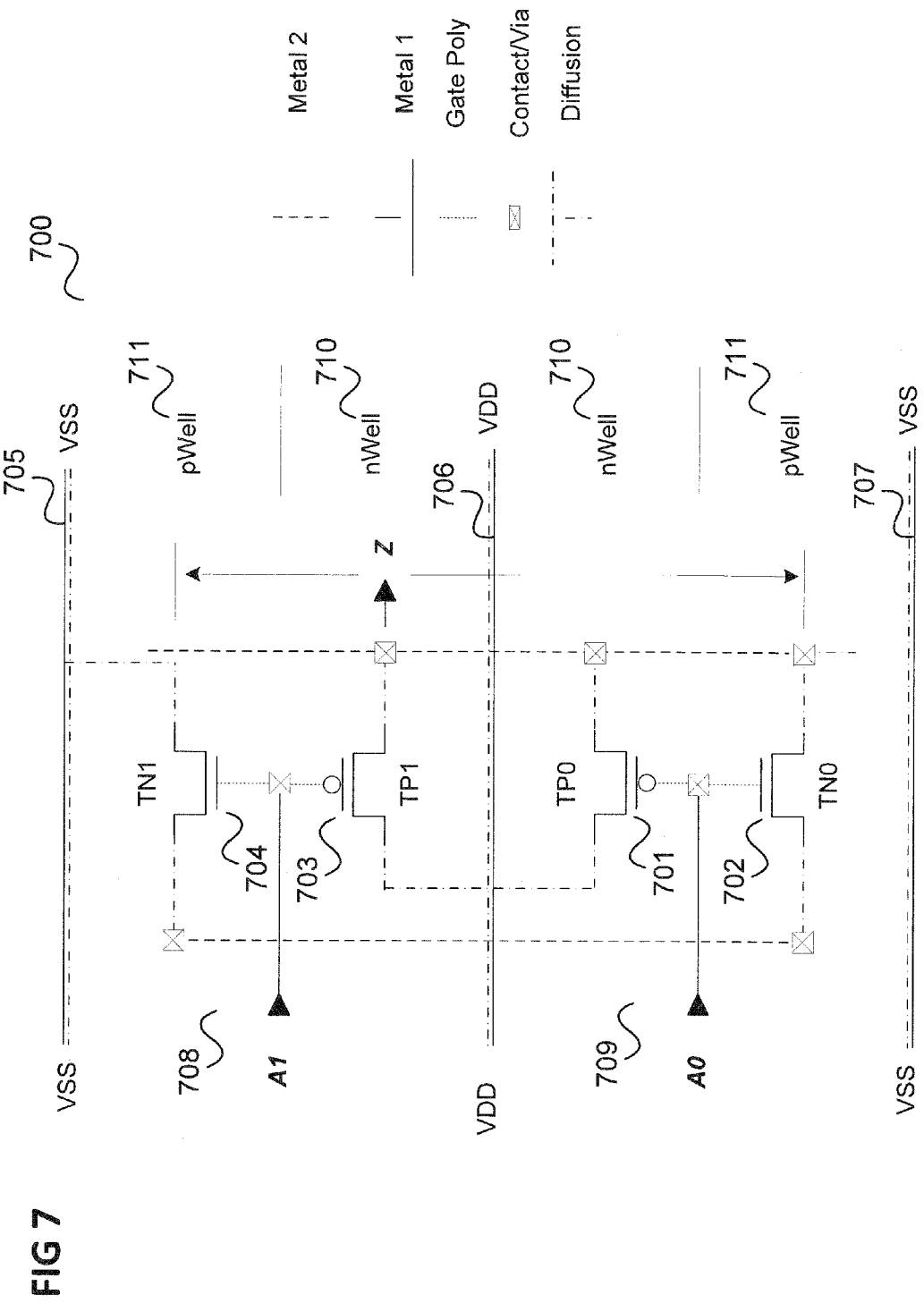
FIG. 7 illustrates the implementation of a NAND gate according to one embodiment.

Examples for an application of the SPLIT GATE approach to the NAND gate 400 are given in FIGS. 6 and 7.

FIG. 6 illustrates the implementation of a NAND gate 600 according to one embodiment.

The illustration of FIG. 6 can be seen as a "physical schematic", indicating the relative positions of nMOS and pMOS transistors within two neighbouring standard cell rows as well as the intra-cell wirings (diffusion, gate poly, M1 and M2, i.e. metal-1 and metal-2, i.e. second metal layer), contacts and vias.

The NAND gate 600 includes a first p channel MOSFET 601 corresponding to the first p channel FET 401, a second p channel MOSFET 603 corresponding to the second p channel FET 403, a first n channel MOSFET 602 corresponding to the first n channel FET 402 and a second n channel MOSFET 604 corresponding to the second n channel FET 404 which are connected as explained with reference to FIG. 4.

The high supply potential is provided by a first supply line 605 and a third supply line 607 and the low supply potential is provided by a second supply line 606. The area between the first supply line 605 and the second supply line 606 is a first cell row 608 and the area between the second supply line 606 and the third supply line 607 is a second cell row 609.

As can be seen, the FETs 601, 602, 603, 604 are distributed over the cell rows 608, 609.

Each cell row includes an nWell 610 and a pWell 611, wherein the p channel MOSFETs 601, 603 are each located within one of the nWells 610 and the n channel MOSFETs 602, 604 are each located within one of the pWells 611. The implementation of the NAND gate as a SPLIT GATE as illustrated in FIG. 6 can be seen as an npn version since the pWells 611 lie next to each other and between the nWells 610.

FIG. 7 illustrates the implementation of a NAND gate 700 according to one embodiment.

The illustration of FIG. 7 can be seen as a "physical schematic", indicating the relative positions of nMOS and pMOS transistors within two neighbouring standard cell rows as well as the intra-cell wirings (diffusion, gate poly, M1 and M2, i.e. first metal layer and second metal layer), contacts and vias.

The NAND gate 700 includes a first p channel MOSFET 701 corresponding to the first p channel FET 401, a second p channel MOSFET 703 corresponding to the second p channel FET 403, a first n channel MOSFET 702 corresponding to the first n channel FET 402 and a second n channel MOSFET 704 corresponding to the second n channel FET 404 which are connected as explained with reference to FIG. 4.

The low supply potential is provided by a first supply line 705 and a third supply line 707 and the high supply potential is provided by a second supply line 706. The area between the first supply line 705 and the second supply line 706 is a first cell row 708 and the area between the second supply line 706 and the third supply line is a second cell row 709.

As can be seen, the FETs 701, 702, 703, 704 are distributed over the cell rows 708, 709.

Each cell row includes an nWell 710 and a pWell 711, wherein the p channel MOSFETs 701, 703 are each located within one of the nWells 710 and the n channel MOSFETs 702, 704 are each located within one of the pWells 711. The implementation of the NAND gate as a SPLIT GATE as illustrated in FIG. 7 can be seen as an pnp version since the nWells 710 lie next to each other and between the pWells 711.

Figure 8:
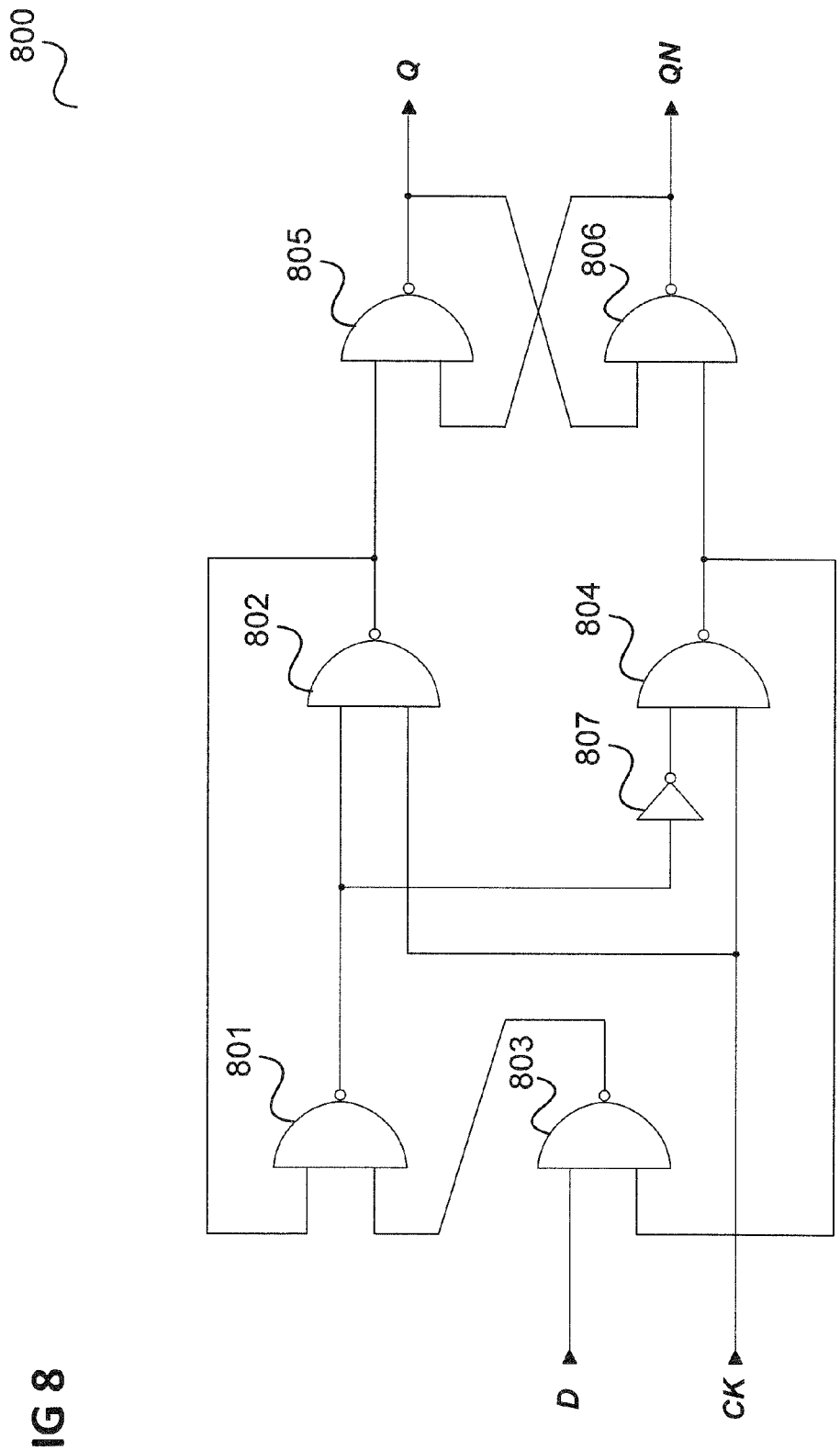
FIG. 8 shows a NAND gate based implementation of a D-Flip-Flop.

NAND gates implemented as SPLIT GATEs for example as illustrated in FIGS. 6 and 7 may for example be used in a NAND based D-Flip-Flop as illustrated in FIG. 8.

FIG. 8 shows a D-Flip-Flop 800.

The D-Flip-Flop 800 includes six NAND gates 801 to 806.

The first NAND gate 801 receives the output of the second NAND gate 802 and the output of the third NAND gate 803 as inputs.

The second NAND gate 802 receives the clock (CK) input signal of the D-Flip-Flop 800 and the output of the first NAND gate 801 as inputs.

The third NAND gate 803 receives the D input signal of the D-Flip-Flop 800 and the output of the fourth NAND gate 804 as inputs.

The fourth NAND gate 804 receives the clock input signal and the output of the first NAND gate 801 inverted by an inverter 807 as inputs.

The fifth NAND gate 805 receives the output of the second NAND gate 802 and the output of the sixth NAND gate 806 as inputs.

The sixth NAND gate 806 receives the output of the fifth NAND gate 805 and the output of the fourth NAND gate 804 as inputs.

The output of the fifth NAND gate 805 forms the output signal Q of the D-Flip-Flop 800.

The output of the sixth NAND gate 806 forms the inverted output signal QN of the D-Flip-Flop 800.

In principle, arbitrary subsets of the NAND gates 801 to 806 constituting the D-Flip-Flop 800 can be implemented as SPLIT-GATE NANDs, i.e. NAND gates according to the SPLIT-GATE approach, for example as illustrated in FIGS. 6 and 7. For instance, the first NAND gate 801, the third NAND gate 803, the fifth NAND gate 805 and the sixth NAND gate 806 could be implemented as SPLIT-GATEs whereas the two central NANDs (i.e. the second NAND gate 802 and the fourth NAND gate 804 which receive the clock signal CK) could be standard NAND gates, e.g. implemented as illustrated in FIG. 5, or vice versa.

Similarly, one or more NAND gates implemented as a SPLIT GATE may be used in any other circuit using one or more NAND gates. In general, the SPLIT-GATE camouflage concept can be applied to any element of a standard cell library. Moreover, the general statement holds that the more complex the gate, the more possibilities exist for conceiving different physical design options for a given gate functionality. This applies in particular to cell based design libraries, for instance ALU non-standard cells or register file macro cells.

Thus, a circuit may be provided with a combination of arbitrarily many combinatorial or sequential SPLIT GATEs. This means that that the SPLIT GATE concept is scalable and allows for security (against reverse engineering) versus cost trade-offs. As a consequence, and if sufficiently many of SPLIT-GATEs are implemented, the reverse engineering effort to unravel their true functions (and the function of the overall circuit) can be significantly increased.

By means of careful physical design it is in many cases possible to provide SPLIT-GATEs that feature only slightly different layouts compared to the respective layouts of other gates. This may be used to further complicate the manual reverse engineering that will be the necessary first step for enhancing the functionality of any automated approach to reverse engineer camouflaged IC implementations.

As a further example, the SPLIT-GATE concept is illustrated for an ANDNOR gate.

Figure 9:
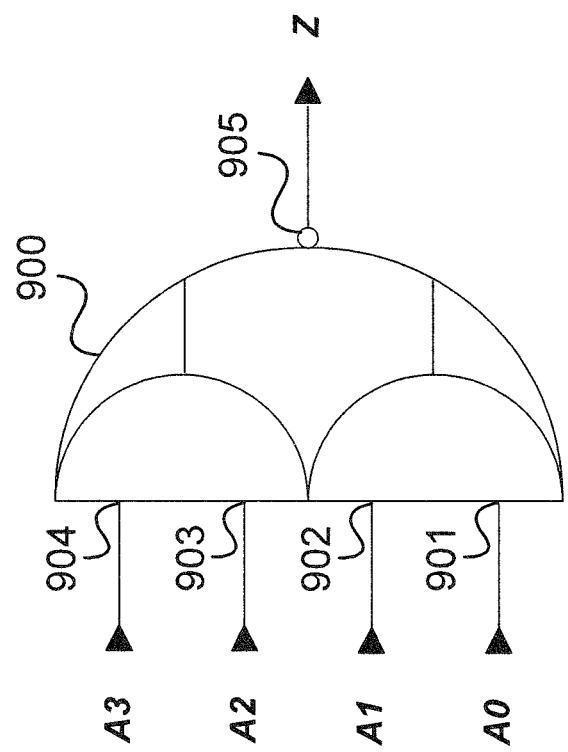
FIG. 9 shows the gate symbol and the inputs and output of an ANDNOR gate.

FIG. 9 shows the gate symbol and the inputs and output of an ANDNOR gate 900.

The ANDNOR gate 900 has a first input 901 receiving a signal A0, a second input 902 receiving a signal A1, a third input 903 receiving a signal A2, a fourth input 904 receiving an output A3 and an output 905 outputting a signal Z wherein Z=NOR(AND(A3,A2),AND(A1,A0)).

Figure 10:
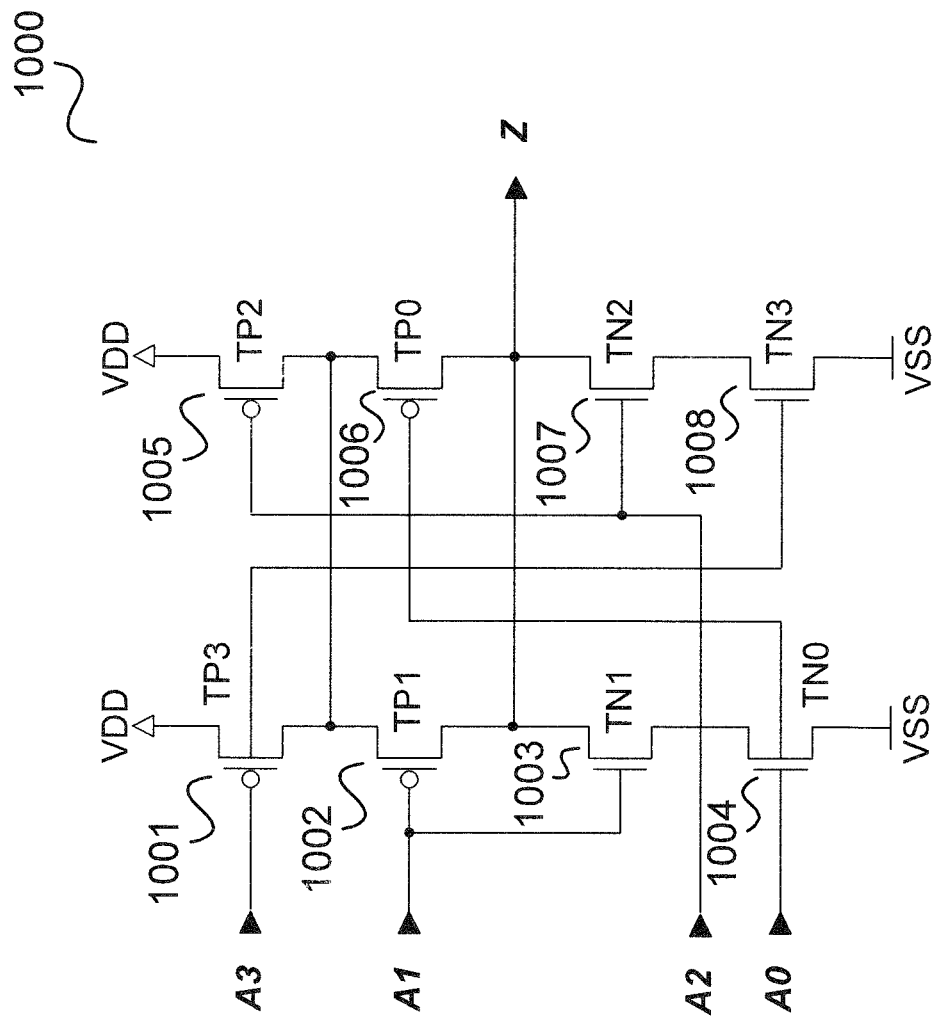
FIG. 10 shows the transistor schematic of an ANDNOR gate.

FIG. 10 shows the transistor schematic of an ANDNOR gate 1000.

The ANDNOR gate 1000 includes a first p channel field effect transistor (FET) 1001 whose source is connected to a high supply potential (VDD), whose gate is supplied with the signal A3 and whose drain is connected to the source of a second p channel FET 1002.

The gate of the second p channel field effect transistor 1002 is supplied with the signal A1 and its drain is connected to the drain of a first n channel FET 1003.

The gate of the first n channel FET 1003 is supplied with the signal A1 and its source is connected to the drain of a second n channel FET 1004 whose source is connected to a low supply potential (VSS) and whose gate is supplied with the signal A0.

The ANDNOR gate 1000 further includes a third p channel field effect transistor 1005 whose source is connected to a high supply potential (VDD), whose gate is supplied with the signal A2 and whose drain is connected to the source of a fourth p channel FET 1006.

The gate of the fourth p channel field effect transistor 1006 is supplied with the signal A0 and its drain is connected to the drain of a third n channel FET 1007. The state at this connection represents the output signal Z.

The gate of the third n channel FET 1007 is supplied with the signal A2 and its source is connected to the drain of a fourth n channel FET 1008 whose source is connected to a low supply potential (VSS) and whose gate is supplied with the signal A3.

An example for an application of the SPLIT GATE approach to the ANDNOR gate 1000 is given in FIG. 11.

FIG. 11 illustrates the implementation of an ANDNOR gate 1100 according to one embodiment.

The illustration of FIG. 11 can be seen as a "physical schematic", indicating the relative positions of nMOS and pMOS transistors within two neighbouring standard cell rows as well as the intra-cell wirings (diffusion, gate poly, M1 and M2, i.e. metal-1 and metal-2, i.e. second metal layer), contacts and vias.

The ANDNOR gate 1100 includes a first p channel MOSFET 1101 corresponding to the first p channel FET 1001, a second p channel MOSFET 1102 corresponding to the second p channel FET 1002, a first n channel MOSFET 1103 corresponding to the first n channel FET 1003, a second n channel MOSFET 1104 corresponding to the second n channel FET 1004 a third p channel MOSFET 1105 corresponding to the second p channel FET 1005, a fourth p channel MOSFET 1106 corresponding to the second p channel FET 1006, a third n channel MOSFET 1107 corresponding to the third n channel FET 1007 and a fourth n channel MOSFET 1108 corresponding to the fourth p channel FET 1008 which are connected as explained with reference to FIG. 10

The high supply potential is provided by a first supply line 1109 and a third supply line 1111 and the low supply potential is provided by a second supply line 1110. The area between the first supply line 1109 and the second supply line 1110 is a first cell row 1112 and the area between the second supply line 1110 and the third supply line 1111 is a second cell row 1113.

As can be seen, the FETs 1101-1108 are distributed over the cell rows 1112, 1113.

Each cell row includes an nWell 1114 and a pWell 1115, wherein the p channel MOSFETs 1101, 1102, 1105, 1106 are each located within one of the nWells 1114 and the n channel MOSFETs 1103, 1104, 1107, 1108 are each located within one of the pWells 1115. The ANDNOR gate 1100, in its implementation as illustrated in FIG. 11 can be to have the form of a Z.

While specific aspects have been described, it should be understood by those skilled in the art that various changes in form and detail may be made therein without departing from the spirit and scope of the aspects of this disclosure as defined by the appended claims. The scope is thus indicated by the appended claims and all changes which come within the meaning and range of equivalency of the claims are therefore intended to be embraced.

What is claimed is:

1. A chip comprising:
    a plurality of supply lines delimiting a plurality of cell areas; and
    a split gate comprising a first transistor and a second transistor, wherein the first transistor is located in a first cell row of the plurality of cell rows and the second transistor is located in a second cell row of the plurality of cell rows such that a supply line of the plurality of supply lines lies between the first cell row and the second cell row; and wherein the first transistor is directly connected to the second transistor.

2. The chip according to claim 1, wherein the split gate is a Boolean or a sequential gate.

3. The chip according to claim 1, wherein the split gate is a complex gate.

4. The chip according to claim 1, wherein the split gate implements a basic Boolean function.

5. The chip according to claim 4, wherein the basic Boolean function is a Boolean NOT, a Boolean AND, a Boolean OR, a Boolean NAND, a Boolean NOR, a Boolean EXOR or a Boolean EXNOR.

6. The chip according to claim 1, wherein the transistors are field effect transistors.

7. The chip according to claim 1, wherein the first transistor and the second transistor are both p channel field effect transistors or are both n channel field effect transistors.

8. The chip according to claim 1, wherein the split gate is implemented in CMOS technology.

9. The chip according to claim 1, wherein the split gate comprises a multiplicity of transistors, wherein a first subset of the multiplicity of transistors is located in the first cell row and a second subset of the multiplicity of transistors is located in the second cell row.

10. The chip according to claim 9, wherein the first subset and the second subset both include both at least one n channel field effect transistor and at least one p channel field effect transistor.

11. The chip according to claim 1, wherein the supply lines of the plurality of supply lines are arranged substantially in parallel to each other.

12. The chip according to claim 11, wherein the plurality of supply lines alternately comprises a supply line for a high supply potential and a supply line for a low supply potential.

13. The chip according to claim 1, wherein each cell row is limited at one side by a supply line for a high supply potential and on another side by a supply line for a low supply potential.

14. The chip according to claim 1, wherein the split gate occupies only a half of the first cell row or only a half of the second cell row according to a horizontal splitting of the cell rows into halves.

15. The chip according to claim 1, comprising a multiplicity of supply lines delimiting a multiplicity of cell rows; and
a multiplicity of split gates, each split gate comprising a first transistor and a second transistor, wherein the first transistor is located in a first cell row of the multiplicity of cell rows and the second transistor is located in a second cell row of the multiplicity of cell rows such that a supply line of the multiplicity of supply lines lies between the first cell row and the second cell row; and wherein the first transistor and the second transistor are directly connected within each split gate.

16. The chip according to claim 15, wherein the multiplicity of split gates is connected to form an integrated circuit.

17. The chip according to claim 15, further comprising one or more further split gates which each lie within one cell row of the multiplicity of cell rows.

18. The chip according to claim 17, wherein the multiplicity of split gates and the one or more further gates are connected to form an integrated circuit.

19. The chip according to claim 1, wherein the direct connection between the first transistor and the second transistor is a serial connection or a parallel connection.

20. The chip according to claim 1, wherein the serial connection comprises a drain of the first transistor connected to a source of the second transistor or a source of the first transistor connected to a drain of the second transistor; and wherein the parallel connection comprises a source of the first gate connected to a source of the second gate and a drain of the first gate connected to a drain of the second gate.

* * * * *